(12) United States Patent
Habboosh

(10) Patent No.: US 7,611,280 B2
(45) Date of Patent: Nov. 3, 2009

(54) EMF SENSOR WITH PROTECTIVE SHEATH

(75) Inventor: Samir W. Habboosh, Hamden, CT (US)

(73) Assignee: Harco Laboratories, Inc., Branford, CT (US)

( * ) Notice: Subject to any disclaimer, the term of this patent is extended or adjusted under 35 U.S.C. 154(b) by 667 days.

(21) Appl. No.: 10/793,121

(22) Filed: Mar. 4, 2004

(65) Prior Publication Data

US 2005/0145960 A1  Jul. 7, 2005

Related U.S. Application Data

(63) Continuation-in-part of application No. 10/736,766, filed on Dec. 16, 2003, now Pat. No. 7,131,768.

(51) Int. Cl.
*G01K 1/08* (2006.01)
*G01K 7/02* (2006.01)
*G01K 7/16* (2006.01)
*G01K 17/06* (2006.01)
*H01L 35/34* (2006.01)

(52) U.S. Cl. .................. 374/208; 374/179; 374/183; 374/163; 136/200

(58) Field of Classification Search .......... 374/179, 374/180, 181, 182, 163, 208, 183, 100; 136/200, 136/227; 73/866.5; 338/25, 28, 22 R; 428/666, 428/670; 148/422, 430; 75/232, 235, 951
See application file for complete search history.

(56) References Cited

U.S. PATENT DOCUMENTS

| | | | | |
|---|---|---|---|---|
| 2,826,625 A | * | 3/1958 | MacDonald | 136/235 |
| 3,049,577 A | | 8/1962 | Hill | |
| 3,098,293 A | * | 7/1963 | Ebdon | 72/39 |
| 3,179,515 A | * | 4/1965 | Grant et al. | 108/90 |
| 3,180,727 A | * | 4/1965 | Alexander et al. | 148/401 |
| 3,189,989 A | * | 6/1965 | Ebdon | 419/20 |
| 3,451,860 A | * | 6/1969 | Schwartzwalder et al. | 136/230 |
| 3,462,318 A | * | 8/1969 | Bjornson | 136/233 |
| 3,468,780 A | * | 9/1969 | Fischer | 204/422 |
| 3,554,816 A | * | 1/1971 | Moen | 136/233 |
| 3,709,667 A | * | 1/1973 | Selman et al. | 75/234 |
| 3,736,109 A | * | 5/1973 | Darling | 428/656 |

(Continued)

FOREIGN PATENT DOCUMENTS

GB  1600575 A  10/1981

(Continued)

OTHER PUBLICATIONS

Oxide Dispersion Hardened Platinum Materials for High Temperature Applications. Fischer et al. 2000.*

(Continued)

*Primary Examiner*—Gail Verbitsky
(74) *Attorney, Agent, or Firm*—St. Onge Steward Johnston & Reens LLC

(57) ABSTRACT

A rugged sensor and method for manufacturing such, for use in hostile environments, the sensor exhibiting high mechanical strength to protect the sensor from physical damage. The sensor system also including a modular component that may variously be connected to the sensor to extension thereof, the modular component also exhibiting high mechanical strength to protect electrical conductors located therein.

22 Claims, 7 Drawing Sheets

U.S. PATENT DOCUMENTS

| | | | | |
|---|---|---|---|---|
| 3,779,714 | A | * | 12/1973 | Nadkarni et al. ............... 75/234 |
| 3,802,926 | A | * | 4/1974 | Blencowe ................... 136/232 |
| 3,821,030 | A | * | 6/1974 | Darling ...................... 136/232 |
| 4,045,247 | A | | 8/1977 | Morris |
| 4,102,708 | A | * | 7/1978 | Dancy ........................ 136/233 |
| 4,111,718 | A | | 9/1978 | Morris |
| 4,168,626 | A | * | 9/1979 | Fullager ..................... 374/158 |
| 4,238,302 | A | * | 12/1980 | Lohrberg .................... 205/350 |
| 4,265,117 | A | * | 5/1981 | Thoma et al. ............... 136/221 |
| 4,315,777 | A | * | 2/1982 | Nadkarni et al. ............. 75/232 |
| 4,420,738 | A | | 12/1983 | Rehmann et al. |
| 4,576,653 | A | * | 3/1986 | Ray ............................ 419/61 |
| 4,675,204 | A | * | 6/1987 | Nicoll et al. ................. 427/551 |
| 4,819,859 | A | * | 4/1989 | Schwenninger ............ 228/190 |
| 4,934,831 | A | * | 6/1990 | Volbrecht ................... 374/183 |
| 5,071,258 | A | * | 12/1991 | Usher et al. ................. 374/140 |
| 5,117,216 | A | | 5/1992 | McQueen |
| 5,275,670 | A | | 1/1994 | Smialek et al. |
| 5,492,482 | A | | 2/1996 | Lockman et al. |
| 5,520,461 | A | * | 5/1996 | Curry et al. ................. 374/179 |
| 5,603,571 | A | * | 2/1997 | Eckert ........................ 374/140 |
| 5,730,931 | A | * | 3/1998 | Poniatowski et al. ........ 420/466 |
| 6,129,997 | A | | 10/2000 | Braun et al. |
| 6,239,351 | B1 | | 5/2001 | Hall, Jr. |
| 6,501,366 | B2 | * | 12/2002 | Takahashi et al. ............. 338/25 |
| 7,044,638 | B2 | * | 5/2006 | Phillips ...................... 374/180 |
| 7,061,364 | B2 | * | 6/2006 | Habboosh ................... 338/28 |
| 2002/0136660 | A1 | * | 9/2002 | Shoji et al. ................... 419/19 |
| 2005/0259719 | A1 | * | 11/2005 | Phillips ...................... 374/179 |

FOREIGN PATENT DOCUMENTS

| | | | | |
|---|---|---|---|---|
| JP | 57127837 | A | * | 8/1982 |
| JP | 57182642 | A | * | 11/1982 |
| JP | 2004053502 | A | * | 2/2004 |
| WO | 02080620 | A1 | | 10/2002 |

OTHER PUBLICATIONS

Lutz, Diana; The Quietly Expanding Rare-Earth Market; The Industrial Physicist; 1996 American Institute of Physics.

Bluestein, Irwin; Understanding Contact Temperature Sensors; Sensors Magazine, Jan. 1999.

Fischer, Bernd; Freund, Dietmar; Bromel, Thomas; Volkl, Rainer; Daniel, Jurgen; Ross, Walter; Teschner, Roman; Michelsen, Carl-Ernst; 25th International Metals Conference, Jun. 9-Jun. 12, 2001, Tucson Arizona.

Wu, Baoyuan; Liu, Ge; Platinum: Platinum-Rhodium Thermocouple Wire, Platinum Metals Rev., 1997, 41, (2), 81-85.

Pages from Primet web site; Rare Earth, Jun. 22, 2003.

Pages from Chemical Elements web site; Periodic Table: Rare Earth, Jun. 22, 2003.

Page from Heraeus web site, Precious Metals Technology.

JM Noble Metals, ZGS Platinum Materials.

Pages from Engelhard-Clal web site; ODS, Oxide Dispersion Strengthened Platinum-Based Materials; Copyright 2000-2001.

Examination Report from the European Patent Office, Application No. 05101638.4-2209, Mar. 17, 2009, 4 pages.

* cited by examiner

EMF SENSOR WITH PROTECTIVE SHEATH

PRIORITY DOCUMENT

This application is a continuation in part of and claims the benefit of the filing date of U.S. patent application Ser. No. 10/736,766 filed Dec. 16, 2003 now U.S. Pat. No. 7,131,768.

FIELD OF THE INVENTION

The present invention relates to a sensor with electrical conductors attached thereto for transmitting a signal, and more specifically to the construction of a sheath formed of a material exhibiting high mechanical strength for protecting the device from physical damage.

BACKGROUND OF THE INVENTION

Thermocouples are temperature measuring devices which measure temperature by employing dissimilar metal conductors joined at a point or junction where the temperature is to be measured with free ends connected to an instrument to measure a voltage generated across the junction of the dissimilar metals. The bimetallic junction of dissimilar metals has been formed of various metals which provide a thermoelectric differential between the two metals upon exposure to heat.

Conventional devices use a variety of materials to produce thermocouple sensors with high operating temperatures. The various metals used to form thermocouple sensors suffer from the detrimental effects of contamination, ionic migration, sublimation, oxidation and substantial decrease in mechanical strength with increasing operating temperatures. Current sensors are thus limited to an operating envelope of less than 1090° C. (1994° F.) to ensure long term, stable output with minimum drift in resistance. Higher temperature sensors can operate to temperatures up to 2370° C. (4298° F.) but are either limited to specific environmental conditions (such as for instance: a vacuum environment, an inert gas environment, or a hydrogen atmosphere) and/or must be limited to short term operation to prevent premature failure. This temperature operating range has limited the application of these sensors in hostile, high temperature systems such as those commonly encountered in the aerospace, petroleum and glass industries.

Prior art thermocouple sensors have had the disadvantage of melting at fairly low temperature and have required insulation and various sheathing systems to protect the thermocouple during operation at prolonged elevated temperatures. However, this sometimes results in undesirable reactions between the metals in the thermocouple sensor and the materials used in the insulation and sheathing systems.

The problems of undesirable reactions in thermocouple sensors have been aggravated by the temperatures encountered in nuclear reactor systems, rocketry heat sensors, high-temperature and vacuum processing and other applications where temperature measurements at or above 1500° C. (2730° F.) are involved. Thermocouples have utilized sheathing and insulation in an effort to prevent the disintegration of the thermocouple in such systems. The insulation and sheathing systems have the further disadvantage of resulting in time delays in obtaining temperature readings due to the insulation and mechanical packaging designed implemented to prevent failure resulting from such problems as gas leakage at the thermocouple sheath seals, cracked sheaths and other mechanical limitations imposed by ceramic insulated metal sheathed thermocouple sensors.

Prior art bimetallic bare sensor combinations, such as those formed from tungsten and rhenium have generally not proven to be uniformly reliable or to have a useful operational life at extended temperatures due to breakage of the thermocouple hot junction upon initial heating and drifts in EMF temperature relationships. These problems are believed to be the result of thermal and chemical phase transitions and of preferential evaporation of one of the metals in the bimetallic sensor. These sensors are thus limited to vacuum, inert, or hydrogen atmospheres.

Attempts to extend the operational range of thermocouples have typically been limited to use of insulation and sheathing techniques or increasing the high temperature properties of known materials through alloying processes or coatings, the disadvantages of which have been discussed above.

High melting, noble metal thermocouples made of e.g., platinum (Pt), rhodium (Rh), palladium (Pd), iridium (Ir) and alloys thereof are known in the art. For example, some widely used thermocouples for measurement of temperatures above 1000° C. (1830° F.) are: (Pt/Pt—13% Rh); (Pt/Pt—10% Rh); and (Pt—6% Rh/Pt—30% Rh). Each leg of the thermocouple is made of a wire or thin film of Pt and/or Pt—Rh. The EMF-temperature responses for these devices, the basis of temperature measurement via thermocouples, are moderate and oxidation resistance is good. These thermocouples can be used with moderate to severe drift (i.e., a change in EMF with time due to any cause such as composition change, oxidation or chemical attack) up to 1500° C. (2730° F.). Other noble metal elements, e.g., palladium and iridium, and precious metal elements, e.g. gold and silver or alloys thereof with platinum are also useful to form thermocouples. Such thermocouples, however, are not widely used because they are more susceptible to oxidation than platinum, and degrade by drift caused by selective oxidation.

Some of the characteristics of platinum can be improved by the usual alloy hardening method of adding a metal to the platinum base, followed by heat treatment. However, problems can occur after alloying. For example, when a high concentration of any alloying element is added to the platinum base, the electrical properties of the resulting platinum limb become inferior; at the same time the hardening phase will partially or totally dissolve into the base at high temperatures, thus the effects of the hardening action will be reduced.

Dispersing oxides of transition metals or rare earth metals within noble or precious metals is an example of a method of creating thermocouple materials with the desired extended temperature properties. For instance, dispersion hardened platinum materials (Pt DPH, Pt—10% Rh DPH, Pt—5% Au DPH) are useful materials because they achieve very high stress rupture strengths and thus permit greatly increased application temperatures than the comparable conventional alloys.

Dispersion hardening (DPH) creates a new class of metal materials having resistance to thermal stress and corrosion resistance that is even greater than that of pure platinum and the solid solution hardened platinum alloys. When operational life, high temperature resistance, corrosion resistance and form stability are important, a sensor can be manufactured of DPH platinum and can be used at temperatures close to the melting point of platinum.

Dispersion hardened materials contain finely distributed transition element oxide particles which suppress grain growth and recrystallization even at the highest temperatures and also hinder both the movement of dislocations and sliding at the grain boundaries. The improved high temperature strength and the associated fine grain stability offer considerable advantages.

DPH of platinum has been developed and applied to for instance, the glass industry. For instance, zirconia grain stabilized platinum has been used in the glass industry for the construction of a sheet of material. This approach however, has not previously been used in the measurement field. For instance, the glass industry is focused on stability of the material at high temperature, whereas in the measurement field not only is material stability at high temperature a concern but signal repeatability and quality are critical. In addition, some of the various DPH of platinum approaches taken have utilized a powder material that cannot be utilized and manufactured into a wire for use in a measurement device. Therefore, these techniques are not usable for the measurement field.

Platinum: Platinum-Rhodium Thermocouple Wire: Improved Thermal Stability on Yttrium Addition Platinum, By Baoyuan Wu and Ge Liu, Platinum Metals Rev., 1997, 41, (2), 81-85 is incorporated by reference. The Wu article discloses a process of dispersion hardening platinum for a platinum/platinum-rhodium thermocouple wire which incorporates traces of yttrium in the platinum limb.

As described in the Wu article, the addition of traces of yttrium to platinum as a dispersion phase markedly increases the tensile strength of the platinum at high temperature, prolongs the services life and improves the thermal stability. Yttrium addition prevents the growth in the grain size and helps retain the stable fine grain structure, as the dispersed particles of high melting point resist movements of dislocations and make the materials harder. The strength of a material is related to the movement and number of the dislocations.

In order to harden metals, the movement of the dislocations needs to be restricted either by the production of internal stress or by putting particles in the path of the dislocation. After the melting and annealing process, the majority of the trace yttrium (in the dispersion phase of the platinum) becomes yttrium oxide, which has a much higher melting point than platinum. When the temperature is near the melting point, dispersion hardened particles fix the dislocation, thus hardening the platinum and increasing its strength.

At the same time the grain structure becomes stable after dispersion hardening and there is also microstructural hardening. The dispersed particles affect the recrystallization dynamics, inhibit rearrangement of the dislocations on the grain boundaries and prevent the movement of the grain boundaries. Therefore, this dispersion hardened platinum possesses a stable fine grain structure at high temperature.

The Wu thermocouple meets the output requirements of the Type S standard for thermocouples—those made of Pt: Pt-10% Rh—whose manufacturing tolerances are prescribed by the International Electrotechnical Commission (I.E.C.). Because the platinum-rhodium leg of a conventional thermocouple has much higher tensile strength than a pure platinum leg, the Wu thermocouple dispersion hardened only the platinum leg in order to increase the tensile strength of the platinum leg to balance the strength of the two legs. The Wu thermocouple did not use dispersion hardening in both legs and did not face the challenge of obtaining a repeatable output signal from the thermocouple at an extended range.

This patent outlines a thermocouple sensor with a sheath capable of extending the operating range of this class of sensor up to 1700° C. (3092° F.).

SUMMARY OF THE INVENTION

Accordingly, it is an object of the present invention to provide sensor with a rugged sheath exhibiting high mechanical hardness to protection of the sensor and/or conductors connected thereto.

A further object of the present invention is to provide a sensor with enhanced high temperature operating characteristics and long term, stable output and minimum drift in EMF.

Another object of the present invention is to provide an extended temperature range EMF device that can be configured as a thermocouple for the purpose of measuring localized temperature. Still another object of the present invention is to provide a device which in inverse mode operation can be used as a voltage generator in the presence of a temperature gradient.

Yet still another object of the present invention is to provide an extended temperature range EMF device which in dual mode operation can be implemented as a heat flux sensor. A further object of the invention is to provide a device which can be a part of a parallel array of devices to create a thermopile of increased sensitivity or voltage output.

And still yet another object of the present invention is to provide an EMF device implementing electronics to condition the output and convert it to specified calibrated reference data, or to an industry standard such as a National Institute of Standards and Technology reference or an International Electrotechnical Commission reference.

And yet another object of the present invention is to provide a method for the production of a cost effective, high reliability, stable EMF devices with an operating range of up to 1700° C. (3092° F.) in hostile environments.

These and other objects of the present invention are achieved by providing a sensor which is resistant to degradation at high temperature having two components in contact with each other, with two conductive leads for transmitting an electric signal. The first component is formed of at least one first noble metal and an oxide selected from the group consisting of yttrium oxide, cerium oxide, zirconium oxide, and combinations of these, while the second component is formed of at least one second noble metal, different than the first noble metal, and an oxide selected from the group consisting of yttrium oxide, cerium oxide, zirconium oxide, and combinations of these.

It has been determined that the combination of a noble metal and an oxide selected from the group consisting of yttrium oxide, cerium oxide, zirconium oxide, and combinations of these exhibits both high mechanical strength and high electrical conductive properties.

The objects of the present invention are further achieved in another embodiment by providing a sensor which is resistant to degradation at high temperature having two components in contact with each other, each component capable of transmitting an electric signal. The first component is formed of an oxide selected from the group consisting of transition element oxides and rare earth metal oxides, and combinations of these, where the oxide is dispersion hardened within the grain boundary and within the main body of a first base metal selected from the group consisting of the noble metals and the precious metals, and combination of these. The second component is formed of an oxide selected from the group consisting of the transitional metal oxides and the rare earth metal oxides, and combinations of these, where the oxide is dispersion hardened within the grain boundary and within the main body of a second base metal, that is different from the first base metal, selected from the group consisting of the noble metals and the precious metals, and combination of these.

The objects of the present invention are achieved in yet another embodiment by a method of manufacturing a high temperature resistant sensor by forming a first component from at least one first noble metal and an oxide selected from the group consisting of yttrium oxide, cerium oxide, zirconium oxide, and combinations of these and a second component from at least at least one second noble metal, different than the first noble metal, and an oxide selected from the group consisting of yttrium oxide, cerium oxide, zirconium oxide, and combinations of these. Next, joining said first and second components and attaching a pair of leads connected one each to the first and second component for transmitting electrical signals.

The objects of the present invention are further achieved in another embodiment by providing a sensor which is resistant to degradation at high temperature having a first and second component, each adapted to transmitting an electrical signal. The first component is formed of an oxide selected from the group consisting of yttrium oxide, cerium oxide, zirconium oxide, and combinations of these, where the oxide is dispersion hardened within the grain boundary and within the main body of platinum. The second component formed of an oxide selected from the group consisting of yttrium oxide, cerium oxide, zirconium oxide, and combinations of these, where the oxide is dispersion hardened within the grain boundary and within the main body of a platinum rhodium alloy. This sensor also has a transducer to receive an electrical signal.

The objects of the present invention, in each of the above described embodiments, could be further achieved where an electrical signal comprises a varying voltage and is applied to a transducer. The transducer may be a temperature measuring device. The output of the transducer may correlate to a temperature or a logic function applied to specific calibration data to determine the temperature. The transducer output could correlate to a standard reference output, or could correlate specifically to a National Institute of Standards and Technology or to an International Electrotechnical Commission reference.

The objects of the present invention, in each of the above described embodiments could be additionally achieved where an electrical signal comprises a varying voltage and is applied to a transducer. The transducer may be a conditioner. The output of the conditioner may be a conditioned varying voltage which is adapted to power electronics.

In still another advantageous embodiment a sensor is provided comprising, a first component formed from a first component material, and a first conductor formed from a first conductor material, the first conductor electrically connected to the first component. The sensor further comprises, a second component in electrical contact with the first component, the second component formed from a second component material, and a second conductor formed from a second conductor material, the second conductor electrically connected to the second component. The sensor still further comprises, a sheath enclosing at least the first component and the second component, the sheath formed of a sheath material having at least one noble metal and an oxide selected from the group consisting of yttrium oxide, cerium oxide, zirconium oxide, and combinations of these.

It has further been determined that any standard thermocouple device such as for instance but not limited to a standard type "K" thermocouple may be effectively utilized with the above-listed sheath material that exhibits high mechanical strength.

In yet another advantageous embodiment a method for manufacturing a sensor is provided comprising the steps of, forming a first component from a first component material, forming a first conductor from a first conductor material, and electrically connecting a first conductor to the first component. The method further comprises the steps of, forming a second component from a second component material, forming a second conductor from a second conductor material, and electrically connecting a second conductor to the second component. The method still further comprises the steps of, electrically contacting the first component with the second component to form a junction where the first component meets the second component, forming a sheath of a material having at least one noble metal and an oxide selected from the group consisting of yttrium oxide, cerium oxide, zirconium oxide, and combinations of these, and enclosing at least the first component and the second component in the sheath.

In still another advantageous embodiment a sensor which is resistant to degradation at high temperature is provided comprising, a first component formed from at least a first noble metal and an oxide selected from the group consisting of yttrium oxide, cerium oxide, zirconium oxide, and combinations of these, and a first conductor formed from a first conductor material, the first conductor electrically connected to the first component. The sensor further comprises, a second component in contact with the first component, the second component formed from at least at least a second noble metal, different than the first noble metal, and an oxide selected from the group consisting of yttrium oxide, cerium oxide, zirconium oxide, and combinations of these, and a second conductor formed from a second conductor material, the second conductor electrically connected to the second component. The sensor still further comprises, a sheath enclosing the first and second conductors, the sheath formed of a sheath material having at least a third noble metal and an oxide selected from the group consisting of yttrium oxide, cerium oxide, zirconium oxide, and combinations of these.

In yet another advantageous embodiment a sensor is provided comprising, a first component formed from a first component material, and a first conductor formed from a first conductor material, the first conductor electrically connected to the first component. The sensor further comprises, a second component in electrical contact with the first component, the second component formed from a second component material, and a second conductor formed from a second conductor material, the second conductor electrically connected to the second component. The sensor still further comprises, a sheath enclosing at least the first conductor and the second conductor, the sheath formed of a sheath material having at least one noble metal and an oxide selected from the group consisting of yttrium oxide, cerium oxide, zirconium oxide, and combinations of these.

The invention and its particular features and advantages will become more apparent from the following detailed description considered with reference to the accompanying drawings.

DETAILED DESCRIPTION OF THE DRAWINGS

Figure 1:
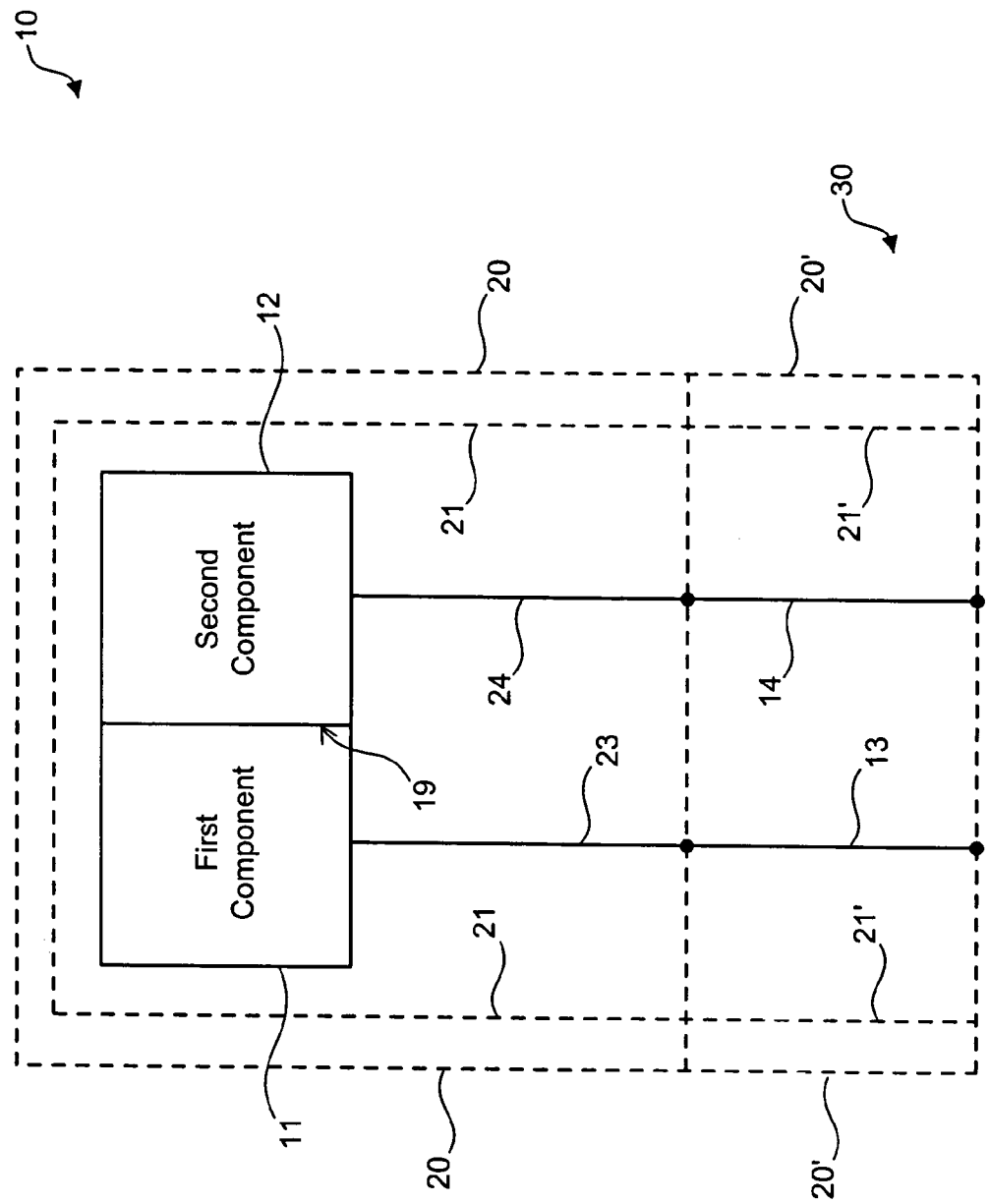
FIG. 1 is a block diagram of one advantageous embodiment of the present invention.

Referring now to the drawings, wherein like reference numerals designate corresponding structure throughout the views.

FIG. 1 is a block diagram illustrating one preferred embodiment of the present invention showing sensor 10. A first component 11 is illustrated in contact with a second component 12 forming a junction 19. Also shown are first conductor 23 and second conductor 24 electrical connected to the first component 11 and the second component 12 respectively.

Sensor 10 is further illustrated in FIG. 1 with insulation 21. The insulation may comprise any suitable insulating material desired including but not limited to a refractory ceramic material such as for instance, $Al_2O_3$ or MgO. Although insulation 21 is shown in FIG. 1 enclosing sensor 10, it is contemplated that insulation 21 may only enclose a portion of sensor 10, such as for instance, first and second conductors 23, 24 or first and second component 11, 12 or any other portion thereof.

Also illustrated in FIG. 1 is sheath 20 shown enclosing insulation 21. Sheath 20 may comprise, for instance, a noble metal such as a platinum group metal, and a metal oxide selected from the group consisting of yttrium oxide, cerium oxide, zirconium oxide, and combinations of these. It is further contemplated that through an annealing process called dispersion hardening, the metal oxides may be deposited within the grain boundaries and main body of the noble metal. This process produces a sheath 20 formed of a highly stable material capable of withstanding mechanical loads and chemical attacks at elevated temperatures while maintaining its internal chemical integrity. This is highly desirable especially in hostile environments where the sensor is subjected to mechanical stress and/or a wide range of temperatures.

Figure 1A:
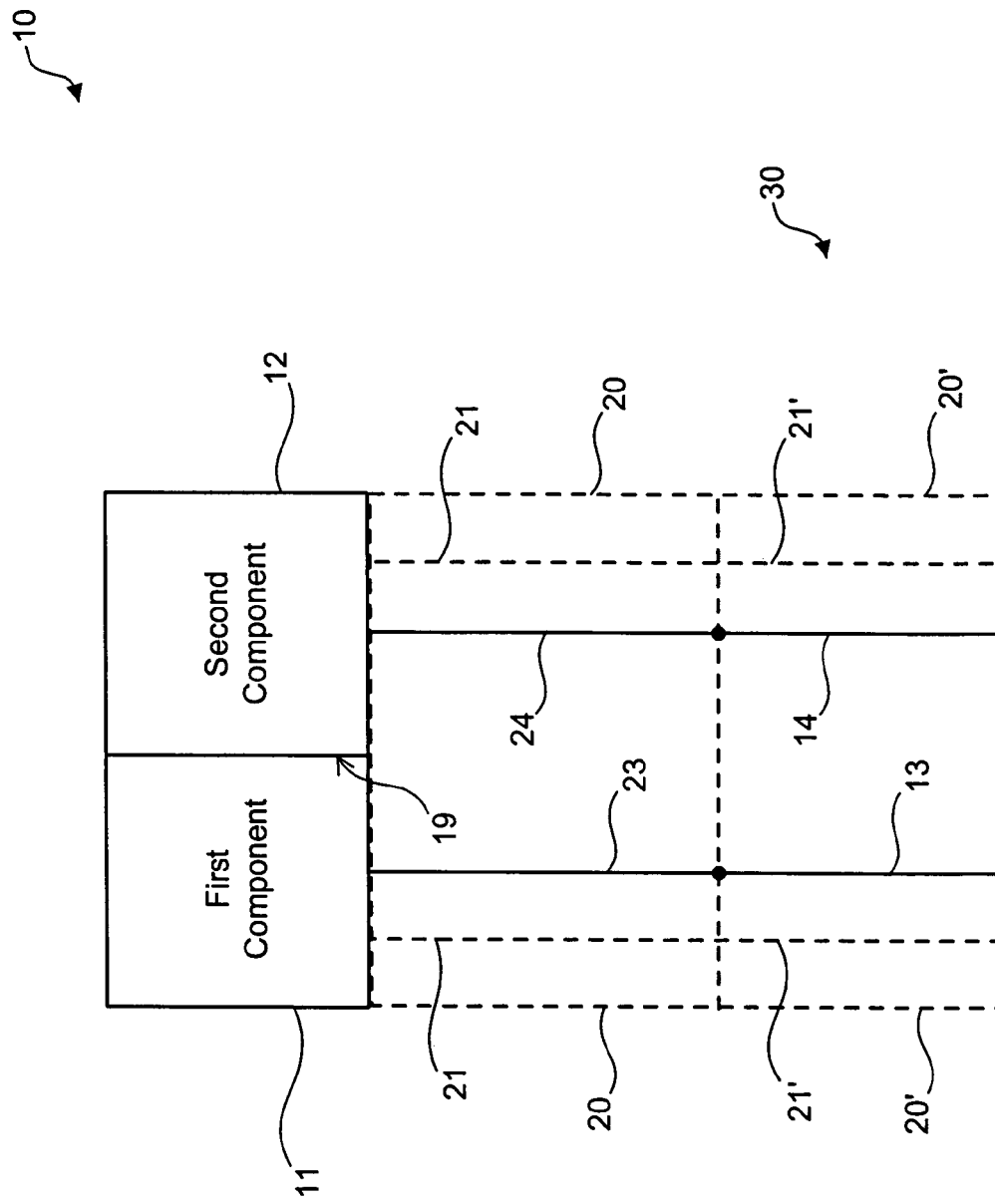
FIG. 1A is a block diagram of the advantageous embodiment according to FIG. 1.
Figure 1B:
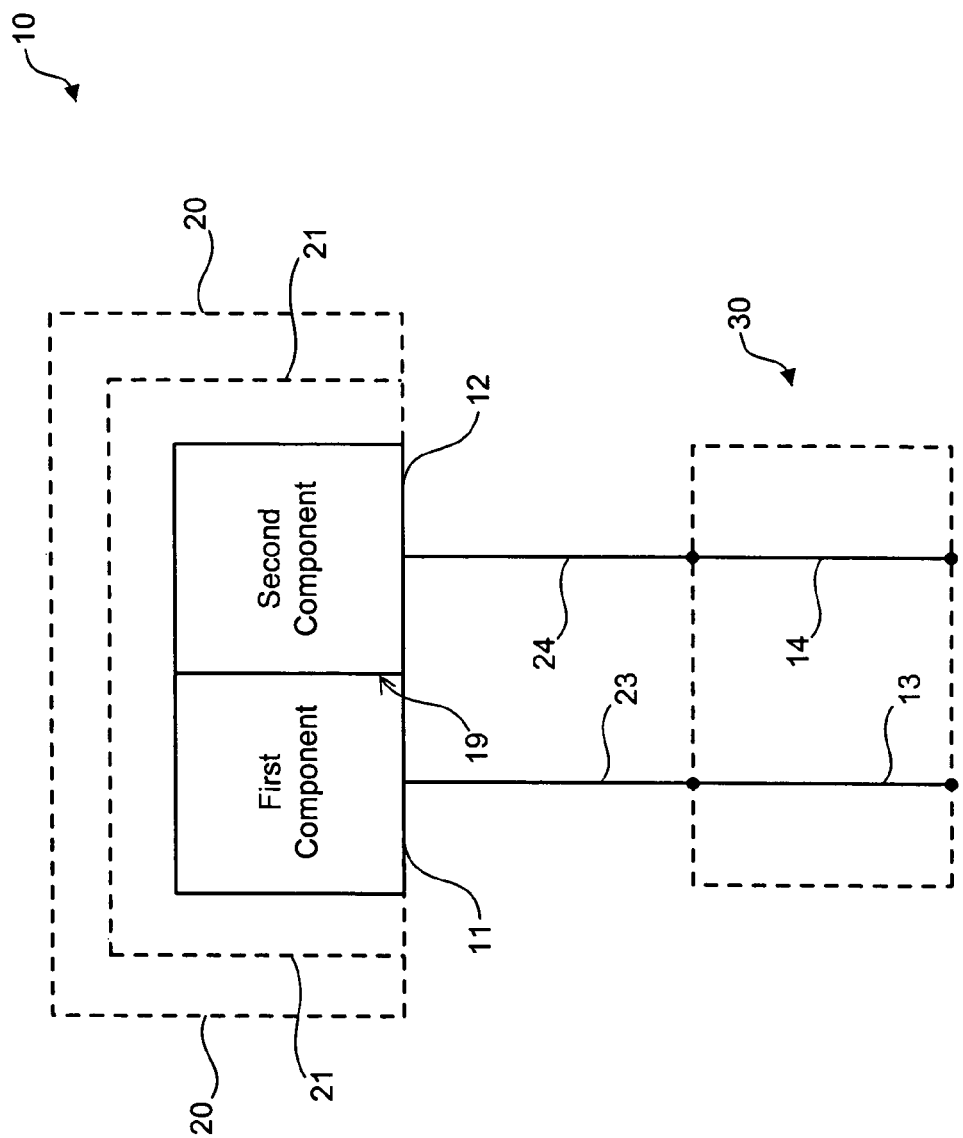
FIG. 1B is a block diagram of the advantageous embodiment according to FIG. 1.

In one preferred embodiment sheath 20 comprises platinum, having yttrium oxide or yttrium and zirconium oxide dispersed within its grain boundary and within the main body. In another preferred embodiment the sheath 20 comprises a platinum rhodium alloy (10% rhodium) having yttrium oxide or yttrium and zirconium oxide dispersed within its grain boundary and within the main body. Although sheath 20 is shown in FIG. 1 enclosing sensor 10, it is contemplated that sheath 20 may only enclose a portion of sensor 10, such as for instance, first and second conductors 23, 24 (FIG. 1A) or first and second component 11, 12 (FIG. 1B) or any other portion thereof.

It is contemplated that the first and second components 11, 12 along with the first and second conductors 23, 24 may comprise for instance, any standard thermocouple device such as for instance but not limited to a standard type "K" thermocouple with the first and second conductors 23, 24 enclosed by the sheath 20, which has been previously described.

Still further illustrated in FIG. 1 is transmit lead module 30 that includes transmit leads 13, 14. Also illustrated in FIG. 1 is transmit lead module insulation 21' enclosing transmit leads 13, 14. Transmit lead module insulation 21' may comprise any material as previously described in connection with insulation 21. Further illustrated is transmit lead module sheath 20', which encloses transmit lead module insulation 21'. Transmit lead module sheath 20' may also comprise any material as previously described in connection with sheath 20. It is further contemplated that, although only one transmit lead module 30 is shown in FIG. 1, any number may be connected together, for instance in an end-to-end fashion, as required depending upon the installation.

Referring now to FIGS. 2-6, a sensor 10, is made of components of a class of materials chosen to be resistant to degradation in high temperature operation up to 1700° C. (3092° F.). The first component 11 and the second component 12 are dissimilar materials within a class. The class of materials is made up of one or more base metals, usually a noble metal, with metal oxides selected from the group consisting of yttrium oxide, cerium oxide, zirconium oxide, and combinations of these. Through an annealing process not described herein, the metal oxides may be deposited within the grain boundaries and main body of the base metal. The process is called dispersion hardening. This has the effect of stabilizing the grain structure of the material at extended temperatures and provides an increased resistance path for impurities. The net effect is a highly stable material capable of withstanding mechanical loads and chemical attacks at elevated temperatures while maintaining its internal chemical integrity. This provides the foundation for an extended temperature range EMF device with long term, stable output and minimum drift in EMF.

The base metal may be chosen from the noble metals such as for instance, from the platinum group metals. In one preferred embodiment the first component 11 comprises platinum, having yttrium oxide or yttrium and zirconium oxide dispersed within its grain boundary and within the main body. In another preferred embodiment the second component 12 comprises a platinum rhodium alloy (10% rhodium) having yttrium oxide or yttrium and zirconium oxide dispersed within its grain boundary and within the main body.

The basic shape of components 11, 12 is not limited. The components can have a variety of cross sectional geometries as desired for the particular application. Furthermore, the components may be manufactured by depositing the material onto a substrate. The substrate may comprise the same class of material as the components, having at least one noble metal with a metal oxide from the group consisting of yttrium oxide, cerium oxide, zirconium oxide, and combinations of these, dispersed within its grain boundary and within the main body. Refractory materials of varying compositions such $Al_2O_3$ or MgO may also be used as the substrate.

Many varying structures may be utilized to for components 11, 12. All that is necessary is that the components contact each other such that they share a junction 19. In addition each component must also have a second junction end that does not contact the other component. In one advantageous embodiment first conductor 23 and second conductor 24 for transmitting electrical energy, may be electrically connected between each junction end and a transducer/conditioner 15. In addition, transmit leads 13, 14 may comprise different material compositions than the first and second conductors 23, 24 creating a junction at 17, 18. Another possible junction point 25, 26 may comprise still another differing material composition than the transmit leads 13, 14. However, the sensor could be formed such that one or both of the wire components may transmit electrical energy to the transducer/conditioner 15. It should also be noted that the electrical energy may be electrically compensated for these junction points of differing compositions.

The components of the sensor may also be housed in a sheath 20 to protect the device from the hostile environments in which the sensor operates. The sheath 20 may be formed of a high temperature alloy or made from the same class of material as the components, having at least one noble metal with a metal oxide from the group consisting of yttrium oxide, cerium oxide, zirconium oxide, and combinations of these, dispersed within its grain boundary and within the main body.

Figure 2:
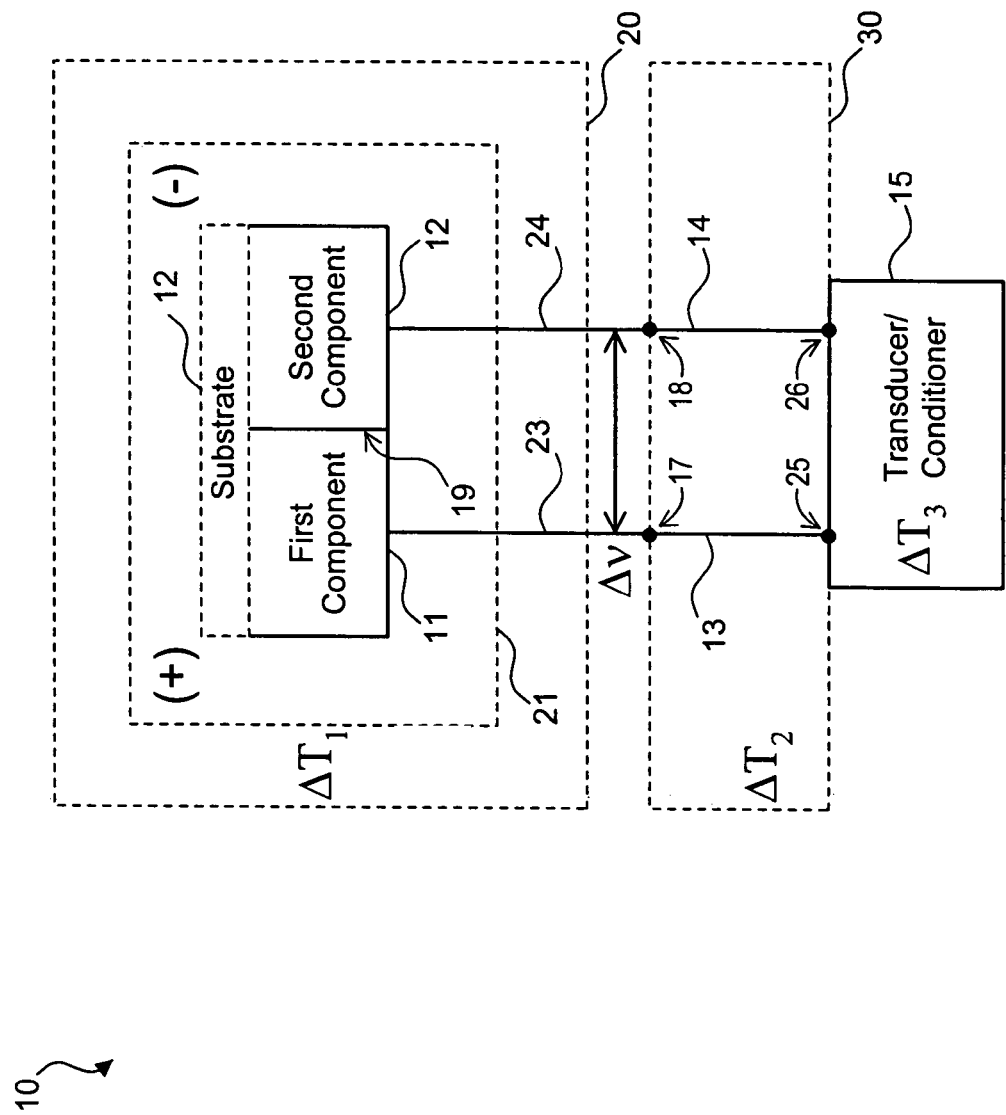
FIG. 2 is a block diagram according to another advantageous embodiment of the present invention.

As illustrated in FIG. 2, the sensor may be insulated between the components 11, 12 and the sheath 20. The insulation 21 may be a refractory ceramic material such as $Al_2O_3$ or MgO.

In operation, the components of the sensor are exposed to a temperature gradient $\Delta T$. The first component 11 interacts with the second component 12 at the junction 19 such that electrical energy/signal or EMF is generated based upon the temperature gradient $\Delta T$. The electrical signal may comprise, for instance, a varying voltage ($\Delta v$). The electrical signal may then be transmitted to the transducer/conditioner 15.

In one advantageous embodiment as illustrated in FIG. 2, first and second conductors 23, 24 terminate at junctions 17, 18 respectively. From junctions 17, 18 transmit leads 13, 14 extend to junction point 25, 26 to terminate at transducer/conditioner 15. In FIG. 2, transmit leads 13, 14 are illustrated located inside transmit lead module 30.

Figure 3:
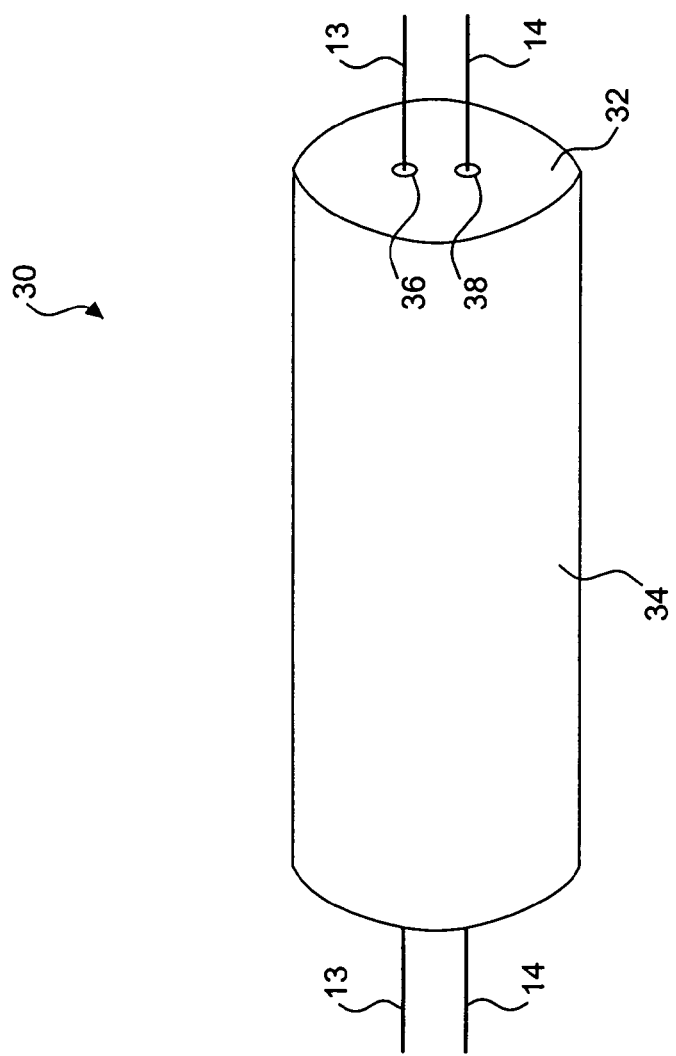
FIG. 3 is an illustration of a transmit lead module according to FIG. 2.

The structure and method for manufacturing transmit lead module 30 in one advantageous embodiment as illustrated in FIG. 3, will now be described. Transmit lead module 30 generally comprises: transmit leads 13, 14; insulating layer 32; and outer layer 34. Transmit leads 13, 14 may comprise any suitable materials as previously described herein in connection with FIG. 2. Insulating layer 32 may comprise, for instance, a refractory ceramic material such as $Al_2O_3$ or MgO generally formed into an elongated member such as a cylinder. Also illustrated in FIG. 3 are two through holes 36, 38 extending axially through the length of insulating layer 32 through which transmit leads 13, 14 are respectively inserted. Surrounding and encasing insulating layer 32 is outer layer 34. Outer layer 34 may comprise in one advantageous embodiment, the same material as one of transmit leads 13, 14. One advantage realized from this particular configuration is that one of the electrical lead/transmit lead cold junctions may be eliminated.

Once the insulating layer 32 containing transmit leads 13, 14 is inserted into outer layer 34, the entire transmit lead module 30 may be swaged or drawn. The compression of transmit lead module 30 causes insulating layer 32 to be compressed and tightly crushed such that air is evacuated and any air pockets within transmit lead module 30 may be effectively eliminated.

Any number of transmit lead modules 30 may then be tied together depending upon the distance between the sensor and the transducer/conditioner 15. This provides versatility and modularity to the system as the installer may utilize any number of transmit lead modules 30 in an installation. Transmit lead modules 30 may further be bent and manipulated as desired to custom fit a particular installation. The outer layer 34 being rigid further provides protection for transmit leads 13, 14 from wear, abrasion and repeated bending and/or flexing. This will increase the effective lifespan of the system. In addition, as previously discussed, transmit lead modules 30 may be joined together with each other in an end-to-end fashion with transmit leads 13, 14 in the first transmit lead module 30 forming a junction with transmit leads 13, 14 in the second transmit lead module 30. However, when the exterior layer 34 for both the first and second transmit lead modules 30 comprises the same material as one of the transmit leads 13, 14, then the corresponding transmit lead junction may be eliminated further simplifying the system.

Whenever transmit leads are joined of differing composition this creates a potential for a secondary, tertiary, etc. EMF voltage which reacts with the primary EMF resulting in a shift in output. To maintain the maximum accuracy the cold junction temperature must be measured with an external EMF device whose output is used to correct for the error either by an external user device or implemented in the logic function.

Figure 4:
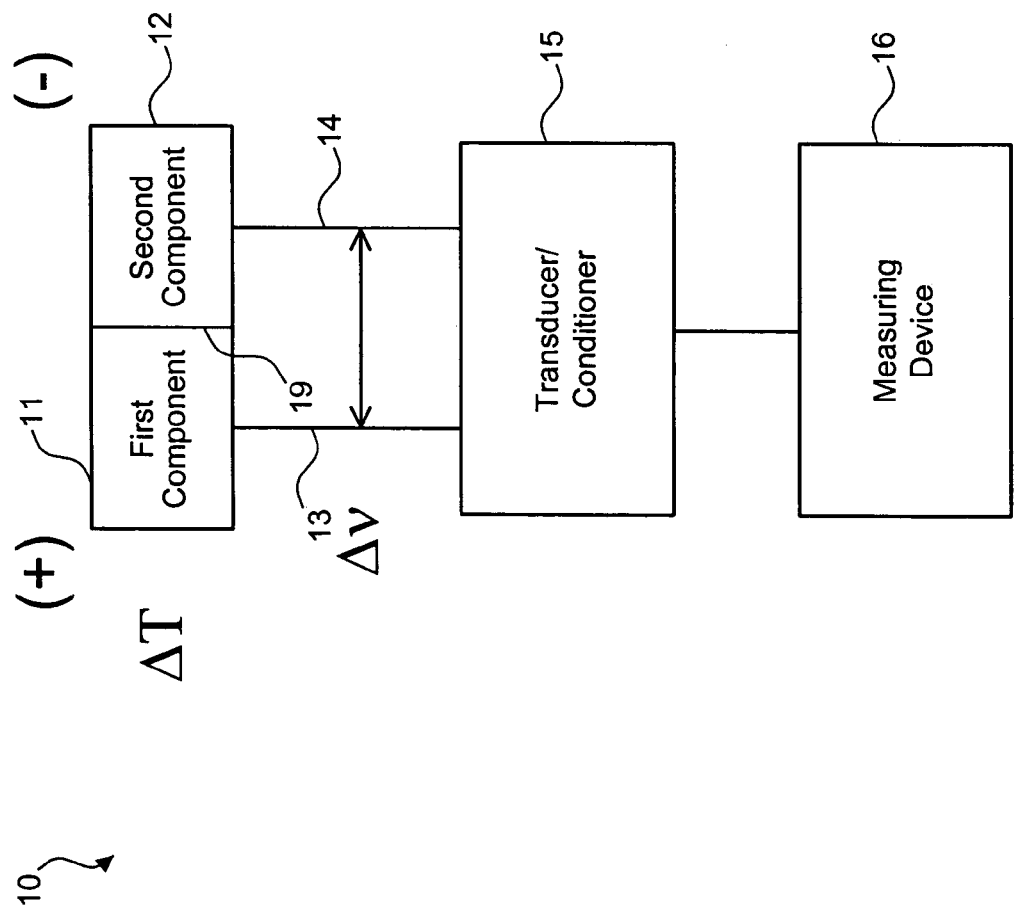
FIG. 4 is a block diagram of another embodiment of the present invention according to FIG. 2.
Figure 5:
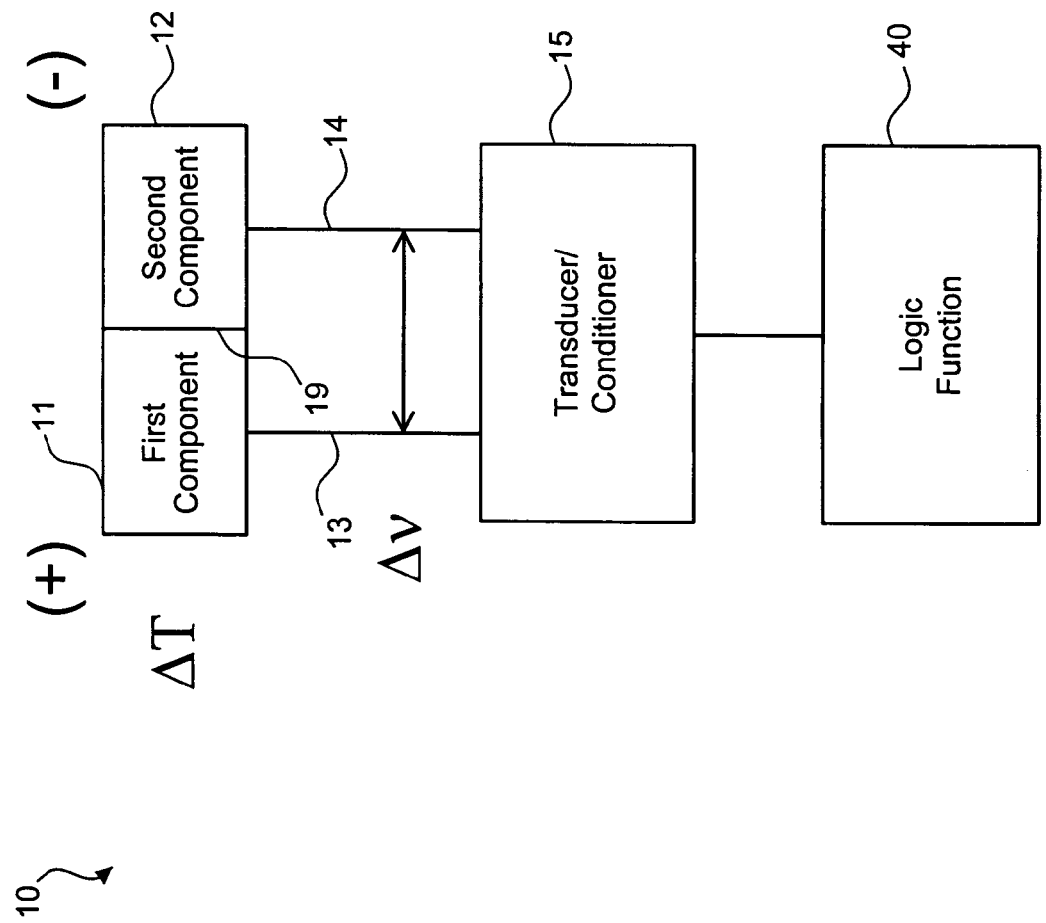
FIG. 5 is a block diagram of another embodiment of the present invention according to FIG. 2.

If the sensor is arranged as a thermocouple for the purpose of measuring localized temperature, the varying voltage will correlate to a temperature. The output from the transducer would then be a temperature reading from a temperature measuring device 16. (FIG. 4). Certain reference conversions exist to determine temperature from a varying voltage output from a thermocouple. These standards are determined by such agencies as the National Institute of Standards and Technology and the International Electrotechnical Commission. The standards are based upon the properties of the material of the thermocouple components and the temperature ranges to which the thermocouple is subjected.

No standard reference to correlate the varying voltage to a temperature reading is available for the class of materials used in the present invention. Accordingly, a logic function 40 (FIG. 5) can be applied to the varying voltage to convert it to one of the known industry standards and corrects for cold junction potential generated or created at junction 17, 18 and/or the transition at junction point 25, 26. This would make the thermocouple an off the shelf component.

The output of the sensors need not be converted to an NIST standard to make it usable. In some applications, calibration data can be supplied along with a basic algorithm which would be implemented in a control system developed by an outside source. In this case the algorithms would be customized to the user's particular application.

In inverse mode operation, the sensor can be used as a voltage generator in the presence of a temperature gradient. The varying voltage output could be conditioned as a power source to power electronics negating the need for an internal power supply.

In dual mode operation, the sensor could be implemented as a heat flux sensor. Under either application, measuring temperature or as a voltage generator, the sensor could be configured as a part of a parallel array of sensors to create a thermopile of increased sensitivity or voltage output.

Although the invention has been described with reference to particular ingredients and formulations and the like, these are not intended to exhaust all possible arrangements or features, and indeed many other modifications and variations will be ascertainable to those of skill in the art.

What is claimed is:

1. A sensor comprising:
a first component formed from a first component material;
a first conductor formed from a first conductor material, said first conductor electrically connected to said first component;
a second component in electrical contact with said first component, said second component formed from a second component material;
a second conductor formed from a second conductor material, said second conductor electrically connected to said second component;
a sheath enclosing at least said first component and said second component, said sheath formed of a sheath material having a platinum rhodium alloy, with at least 10% rhodium, and an oxide selected from the group consisting of yttrium oxide, cerium oxide, zirconium oxide, and combinations of these; and said oxide is dispersion hardened within grain boundaries and a main body portion of the noble metal.

2. The sensor of claim 1 wherein the first conductor material and the second conductor material are the same.

3. The sensor of claim 2 wherein the first conductor material and the second conductor material are different than the sheath material.

4. The sensor of claim 1 wherein the first component material comprises at least a first component noble metal and an oxide selected from the group consisting of yttrium oxide, cerium oxide, zirconium oxide, and combinations of these.

5. The sensor of claim 4 wherein the second component material comprises at least a second component noble metal, different than the first component noble metal, and an oxide selected from the group consisting of yttrium oxide, cerium oxide, zirconium oxide, and combinations of these.

6. The sensor of claim 1 further comprising an insulting layer enclosing said first and second conductors.

7. The sensor of claim 6 wherein said insulating layer is enclosed by said sheath.

8. A method for manufacturing a sensor comprising the steps of:
providing a first component of a first component material;
electrically connecting a first conductor to the first component;
providing a second component of a second component material;
electrically connecting a second conductor to the second component;
electrically contacting the first component with the second component to form a junction where the first component meets the second component;
forming a sheath of a material having a platinum rhodium alloy, with at least 10% rhodium, and an oxide selected from the group consisting of yttrium oxide, cerium oxide, zirconium oxide, and combinations of these;
dispersion hardening the oxide within grain boundaries and a main body portion of the noble metal; and
enclosing at least the first component and the second component in the sheath.

9. The method of claim 8 wherein the first conductor material and the second conductor material are the same.

10. The method of claim 9 wherein the first conductor material and the second conductor material are different than the sheath material.

11. The method of claim 10 further comprising the step of enclosing the first conductor and the second conductor with an insulating layer.

12. The method of claim 11 wherein the sheath encloses the insulating layer.

13. A sensor which is resistant to degradation at high temperature comprising:
a first component formed from at least a first noble metal and an oxide selected from the group consisting of yttrium oxide, cerium oxide, zirconium oxide, and combinations of these;
a first conductor formed from a first conductor material, said first conductor electrically connected to said first component;
a second component in contact with said first component, said second component formed from at least at least a second noble metal, different than the first noble metal, and an oxide selected from the group consisting of yttrium oxide, cerium oxide, zirconium oxide, and combinations of these;
a second conductor formed from a second conductor material, said second conductor electrically connected to said second component;
a sheath enclosing said first and second conductors, said sheath formed of a sheath material having a platinum rhodium alloy, with at least 10% rhodium, and an oxide selected from the group consisting of yttrium oxide, cerium oxide, zirconium oxide, and combinations of these; and
said oxide is dispersion hardened within grain boundaries and a main body portion of the noble metal.

14. The sensor according to claim 13 further comprising:
a transmit lead module having,
a first transmit lead formed of a first transmit lead material, for electrically connecting to said first conductor;
a second transmit lead formed of a second transmit lead material, for electrically connecting to said second conductor; and
a transmit lead module sheath enclosing said first transmit lead and said second transmit lead.

15. The sensor of claim 14 wherein said transmit lead module sheath is formed of a fourth noble metal and an oxide selected from the group consisting of yt-trium oxide, cerium oxide, zirconium oxide, and combinations of these.

16. The sensor of claim 15 wherein said transmit lead module further comprises an insulating layer enclosing said first transmit lead and said second transmit lead.

17. The sensor of claim 16 wherein said transmit lead module sheath encloses said insulating layer.

18. The sensor of claim 13 wherein the first conductor material and the second conductor material are the same.

19. The sensor of claim 18 wherein the first conductor material and the second conductor material are different than the sheath material.

20. A sensor comprising:
a first component formed from a first component material;
a first conductor formed from a first conductor material, said first conductor electrically connected to said first component;
a second component in electrical contact with said first component, said second component formed from a second component material;
a second conductor formed from a second conductor material, said second conductor electrically connected to said second component;
a sheath enclosing at least said first conductor and said second conductor, said sheath formed of a sheath material having a platinum rhodium alloy, with at least 10% rhodium, and an oxide selected from the group consisting of yttrium oxide, cerium oxide, zirconium oxide, and combinations of these; and
said oxide is dispersion hardened within grain boundaries and a main body portion of the noble metal.

21. A sensor comprising:
a first component formed from a first component material;
a first conductor formed from a first conductor material, said first conductor electrically connected to said first component;
a second component in electrical contact with said first component, said second component formed from a second component material;
a second conductor formed from a second conductor material, said second conductor electrically connected to said second component; and a sheath, electrically insulated from and enclosing at least said first component and said second component, said sheath formed of a sheath material having a platinum rhodium alloy, with at least 10% rhodium, and an oxide selected from the group consisting of yttrium oxide, cerium oxide, zirconium oxide, and combinations of these;

said sheath having a higher melting point that said first and second components.

22. A sensor comprising:

a first component formed from a first component material;

a first conductor formed from a first conductor material, said first conductor electrically connected to said first component;

a second component in electrical contact with said first component, said second component formed from a second component material;

a second conductor formed from a second conductor material, said second conductor electrically connected to said second component;

a sheath, electrically insulated from and enclosing at least said first conductor and said second conductor, said sheath formed of a sheath material having a platinum rhodium alloy, with at least 10% rhodium, and an oxide selected from the group consisting of yttrium oxide, cerium oxide, zirconium oxide, and combinations of these;

said sheath having a higher melting point that said first and second conductors.

* * * * *